(12) United States Patent
Leu (10) Patent No.: US 6,174,771 B1
(45) Date of Patent: Jan. 16, 2001

(54) SPLIT GATE FLASH MEMORY CELL WITH SELF-ALIGNED PROCESS

(75) Inventor: Len-Yi Leu, Hsinchu (TW)

(73) Assignee: Winbond Electronics Corp., Hsinchu (TW)

( * ) Notice: Under 35 U.S.C. 154(b), the term of this patent shall be extended for 0 days.

(21) Appl. No.: 09/193,300

(22) Filed: Nov. 17, 1998

(51) Int. Cl.[7] .................................................. H01L 21/336
(52) U.S. Cl. ........................ 438/257; 438/211; 438/264; 438/283; 438/594; 438/439
(58) Field of Search .................................. 438/283, 257, 438/258, 262, 263, 264, 211, 593, 594, 439

(56) References Cited

U.S. PATENT DOCUMENTS

| | | | |
|---|---|---|---|
| 5,811,853 | * | 9/1998 | Wang .................................... 257/316 |
| 5,950,087 | * | 9/1999 | Hsieh et al. .......................... 438/264 |
| 6,027,971 | * | 2/2000 | Cho et al. ............................ 438/257 |
| 6,046,086 | * | 4/2000 | Lin et al. ............................. 438/264 |
| 6,114,723 | * | 9/2000 | Leu ...................................... 257/316 |

* cited by examiner

Primary Examiner—Michael Trinh
(74) Attorney, Agent, or Firm—W. Wayne Liauh

(57) ABSTRACT

A method for fabricating split-gate flash memory cells is disclosed. In this method, the field oxide is formed after the formation of the poly-1 stripes, which eventually become the floating gates, by oxide growth, thus, the misalignment problems often encountered in the prior art processes between the floating gates and the field oxide layers are eliminated or at least minimized. The method also includes the step of forming a dummy CVD dielectric sidewall spacer with a predetermined thickness before the formation of the poly-2 layer, which eventually become the control gates; this greatly eliminates or at least minimizes the disparity in the peripheral control gate lengths between mirror (adjacent) cells. Both of these improvements can significantly contribute to the reduction of cell size without involving expensive upgrades in processing equipment.

8 Claims, 8 Drawing Sheets

SPLIT GATE FLASH MEMORY CELL WITH SELF-ALIGNED PROCESS

FIELD OF THE INVENTION

The present invention relates to an improved method for fabricating split gate flash memories. More specifically, the present invention relates to a self-aligned process for making split-gate flash memory cells which eliminates the misalignment problem that can often occur between the floating gate (FG) and the field oxide (FOX), and/or the misalignment problem between the floating gate and the control gate (CG). The method disclosed in the present invention allows high-quality flash memory cells to be further scaled down in their cell dimension without incurring large capital investment or substantially increasing the manufacturing cost. With the split gate flash memory cells of the present invention, the cell programming is achieved through source coupling, as opposed to the conventional gate coupling, and, therefore, the zero overlap of floating gate on the field oxide does not degrade the programming efficiency.

BACKGROUND OF THE INVENTION

Flash memories are high-density nonvolatile semiconductor memories offering fast access times. Compared to other nonvolatile semiconductor memories such as conventional EPROMs or EEPROMs, flash memories are most suitable for applications wherein there are expected frequent write and read operations. Because of its light weight compared to magnetic memories such as hard disk or floppy disk memories, flash memory has a tremendous potential in the consumer electronics market. With the rapid growth of digital cameras and the desire for light-weight notebook PCs, the demand for even higher density flash memories is ever increasing.

U.S. Pat. Nos. 5,029,130, 5,045,488 5,067,108, and 5,202,850, the contents thereof are incorporated herein by reference, disclose a method of making an electrically programmable and erasable memory device having a re-crystallized floating gate. In the method disclosed in these patents, a substrate is first defined and a first layer of dielectric material is grown over the substrate. A layer of polysilicon or amorphous silicon is then deposited over the first layer. The silicon layer is covered with a protective material and is annealed to form re-crystallized silicon. A portion of the protective material is removed to define a floating gate region. A masking oxide is grown on the floating gate region, and the remainder of the protective material and the re-crystallized silicon thereunder is removed. A second layer of dielectric material is formed over the floating gate and over the substrate, immediately adjacent to the floating gate. Finally, a control gate is patterned and formed and source and drain regions are defined in the substrate.

Figure 1A:
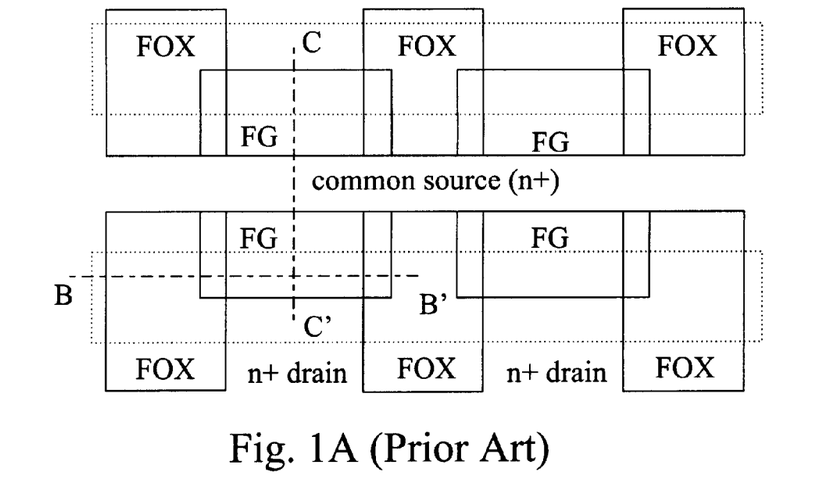
FIG. 1A is a top view cell layout of a flash memory cell according to one of the prior art references.
Figure 1B:
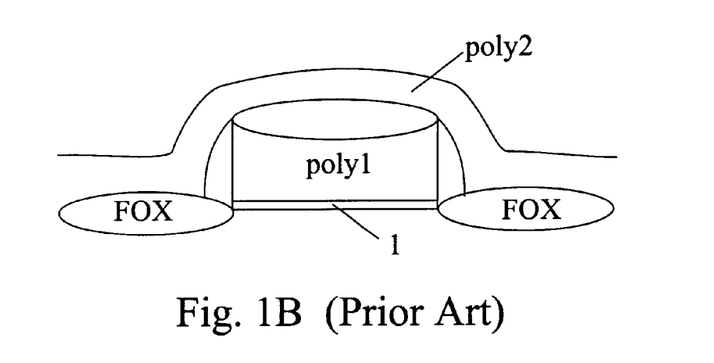
FIGS. 1B and 1C are illustrative cross-sectional views of the flash memory cell as shown in FIG. 1A, along lines B–B' and C–C', respectively.
Figure 1C:
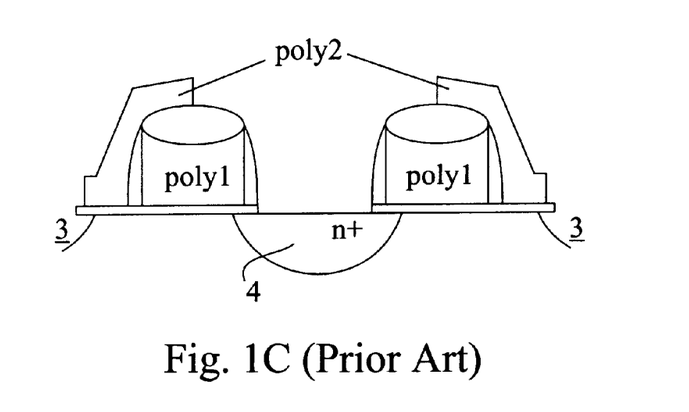

FIG. 1A shows a top view cell layout of a flash memory according to one of the prior art references mentioned above, and FIGS. 1B and 1C are illustrative cross-sectional views of the same flash memory cell along lines B–B' and C–C', respectively. The flash memory cell contains a semiconductor substrate 1, which typically is a P-type silicon substrate with a doping level ranging from 5 to ohm-cm. Within the substrate 1, there are drain region 2, typically an N-doped silicon, a source region 3, also an N-doped silicon, and a channel region 4 between the drain region 2 and the source region 3. A tunnel oxide layer 5 is disposed over the channel region and the source and drain regions. Disposed over the tunnel oxide layer are one or more floating gates (poly-1), which, as shown in FIG. 1C, are positioned over a portion of the drain region 2 and over a portion of the channel region 4. An insulating layer 6, which can be silicon dioxide, silicon nitride, or silicon oxynitride, is disposed covering the floating gate. A control gate is then disposed which covers a portion of the floating gate and a portion of the channel region. During an erase operation, a ground potential is applied to the drain and the source regions, and a high positive voltage is applied to the control gate. The high positive voltage at the control gate causes charges, if any, on the floating gate to be injected through the so-called Fowler-Nordheim tunneling mechanism to tunnel through the insulating layer 6 to the control gate, allowing the floating gate to be discharged.

During programming or write operations, a ground potential is applied to the source region, a positive charge slightly exceeding the threshold voltage of the control gate region is applied to the control gate, and a high positive voltage is applied to the drain region. Under this condition, electrons will be generated by the source region which will flow from the source region towards the drain region through a relatively weakly inverted channel region. These electrons will see a large potential drop across the surface region defined by the gap of sidewall. Some of the electrons will become heated and be injected through the insulating layer into the floating gate, causing the floating gate to be charged. After the power is turned off, the insulating layer surrounding the floating gate prevents the escape of the charges that are stored in the floating gate.

However, several shortcomings in the above described flash memory structure have been recognized by the inventor of the present invention. Some of the more significant shortcomings include: (1) the existence of corner rounding of the field oxide pattern due to bird beak encroachment; (2) the existing of corner rounding of the poly-1 (floating gate) pattern due to limits in the current photolithography technology; (3) misalignment between the floating gate pattern and the field oxide pattern; (4) misalignment between the poly-1 (floating gate) pattern and the poly-2 (control gate) pattern; and (5) non-zero floating gate overlap with respect to the field oxide layer.

The frequent misalignment problem between the float gate pattern and the field oxide pattern becomes a bottleneck problem for the further scaling down of the flash memory cell. The misalignment between the poly-1 (floating gate) pattern and the poly-2 (control gate) pattern also causes different control gate length between two mirror cells. The two different control gate lengths (more specifically the peripheral lengths of the adjacent control gates) are shown as L1 and L2, respectively, in FIG. 1C. The problem of non-zero floating gate overlap with respect to the field oxide layer causes a reduction in the source coupling efficiency as well as other limitations in the cell scaling.

In light of the increasing importance of flash memory in the consumer electronics market, it is essential that substantial research and development efforts be devoted in this area so as to further improve the performance and quality of flash memory cells, and to allow the cell dimensions to be further reduced.

SUMMARY OF THE INVENTION

The primary object of the present invention is to develop an improved method for fabricating flash memory cells. More specifically, the primary object of the present invention is to develop an improved method for fabricating flash memory cells which eliminate many of the corner round-off and misalignment problems that have been experienced using the prior art methods.

Currently, the flash memory cells fabricated from existing methods have shown the following shortcomings:

(1) The existence of corner rounding of the filed oxide pattern due to bird beak encroachment.

(2) The existence of corner rounding of the poly-1 (floating gate) pattern due to limitations in the resolution of current photolithography technology.

(3) Misalignment between the floating gate pattern and the field oxide pattern. This problem has become a bottle-neck problem in attempts to achieve further down-scaling of flash memory cells utilizing the conventional photolithography technology.

(4) Misalignment between the poly-1 (floating gate) pattern and the poly-2 (control gate) pattern. This causes different control gate length immediately above the tunnel oxide layer.

(5) Non-zero floating gate overlap with respect to the field oxide layer. This causes reductions in the source coupling efficiency and limits the extent of cell down-scaling.

The method disclosed in the present invention can be summarized as comprising the following steps:

(1) Forming poly-1/field oxide layer:

In this step, a tunnel oxide layer is formed on a substrate, followed by the deposition of a poly-1 layer with subsequent implantation, and the deposition of a first nitride layer. A poly-1 photomask is formed to define a plurality of stripes along a first direction, i.e., the column direction, and an etching operation is conducted to remove the first nitride layer, poly-1 layer, and tunnel oxide layer not covered by the photoresist. After the photoresist is removed, a thin second nitride layer is formed on the first nitride layer and both are merged together. The deposition of the second nitride layer also forms a pair of sidewall spacers on the sides of the poly-1 layer. Finally a plurality of field oxide stripes are formed by LOCOS (localized oxidation of silicon) or other similar isolation techniques.

(2) Defining Poly-2 layer in the second direction, or row direction:

In this step, a poly-2 photomask is formed to define a discrete poly-1 pattern in the second direction, or the row direction. Then, the portion of the nitride layer not covered by the photoresist is removed by etching, using the poly-1 layer as etch stop. The newly exposed poly-1 layer is then oxidized to form a discontinuous poly oxide layer.

(3) Performing a Poly-1 etch:

In this step, the remaining nitride layer including the nitride sidewall spacers, which do not have a uniform thickness, are removed. Then, the poly oxide layer is utilized as a mask to etch the portion of the poly-1 not covered by the poly oxide layer. The poly-1 layer will ultimately become floating gates.

(4) Performing drain implant:

In this step, a drain implant photomask is first formed above the substrate covering the intended drain region. Then any portion of the field oxide layer which coincides with the intended drain region is removed to prepare for subsequent drain implants. The drain region is formed using arsenic or phosphorous implantation, followed by annealing.

(5) Forming dummy CVD dielectric spacer:

In this step, a CVD dielectric layer such as nitride layer, is formed by chemical vapor deposition, on the poly-1 layer. The CVD dielectric layer is formed to have a thickness similar to the intended peripheral length of the control gate (L). A dry etch is applied to the CVD dielectric layer to cause a CVD dummy sidewall spacer to be formed.

(6) Performing source implant:

In this step, a source implant photomask is formed above the substrate covering the intended source region. Then any portion of the field oxide layer which coincides with the intended source region is removed to prepare for subsequent source implants. The source region is formed using arsenic or phosphorous implantation, followed by annealing.

(7) Performing sidewall oxide growth and thin sidewall nitride deposition

In this step, the dummy CVD dielectric layer is removed. A sidewall oxide is formed by sidewall oxide growth. Then a thin nitride layer is formed surrounding the poly-1 layer. After dry etch, a nitride sidewall spacer is formed on the side of the poly-1 layer. Finally, a peripheral oxide layer is grown to provide a peripheral oxide for the control gate.

(8) Forming Poly-2 layer:

In this step, a poly-2 layer is deposited on the substrate followed by implantation. Then a poly-2 mask is formed to define the word line (WL) and the peripheral control gate length L. After a poly-2 etching, the remaining photoresist is removed to form the control gate in the form of word lines.

With the method disclosed in the present invention, because the field oxide is formed after the formation of the poly-1 stripes by oxide growth, the misalignment problem often encountered in the prior art processes between the floating gates and the field oxide layers are eliminated or at least minimized. But more significantly, the step of forming a dummy CVD dielectric sidewall spacer before the formation of the poly-2 layer also eliminates or at least minimizes the disparity in the peripheral control gate lengths between mirror (adjacent) cells. Both of these improvements can significantly contribute to the reduction of cell size without involving expensive upgrades in processing equipment.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

The present invention discloses an improved method for fabricating flash memory cells. The flash memory cells fabricated from conventional methods typically exhibit the shortcomings of: (1) corner rounding of the field oxide pattern due to bird beak encroachment; (2) corner rounding of the poly-1 (floating gate) pattern due to limits in the resolution of current photolithography technology; (3) misalignment between the floating gate pattern and the field oxide pattern; (4) misalignment between the poly-1 (floating gate) pattern and the poly-2 (control gate) pattern, causing different control gate length immediately above the tunnel oxide layer; and (5) non-zero floating gate overlap with respect to the field oxide layer, this causes reductions in the source coupling efficiency and limits the extent of cell down-scaling. The problem of misalignment between the floating gate pattern and the field oxide pattern has become a bottle-neck problem in attempts to achieve further down-scaling of flash memory cells.

With the method disclosed in the present invention, the field oxide is formed after the formation of the poly-1 stripes by oxide growth, thus, the misalignment problems often encountered in the prior art processes between the floating gates and the field oxide layers can be eliminated or at least minimized. But more significantly, the present invention includes a step of forming a dummy CVD dielectric sidewall spacer with a predetermined thickness before the formation of the poly-2 layer, this greatly eliminates or at least minimizes the disparity in the peripheral control gate lengths between mirror (adjacent) cells. Both of these improvements can significantly contribute to the reduction of cell size without involving expensive upgrades in processing equipment.

In summary, the method disclosed in the present invention comprises the following steps:

(1) Forming a tunnel oxide layer on a substrate, followed by the deposition of a poly-1 layer and a first nitride layer.

(2) Using a first poly-1 mask to define a poly-1 stripe along a first direction, followed by a nitride/poly-1/oxide etch;

(3) Depositing a second nitride layer, followed by anisotropic etch to from a nitride spacer around said poly-1 stripe;

(4) Growing field oxide to form a field oxide layer having a plurality of isolation regions;

(5) Using a second poly-2 mask define a poly-1 pattern along a second direction, followed by a nitride etch on top of said poly-1 pattern and a poly-1 oxidation to form a poly-1 oxide pattern;

(6) Removing remaining nitride on top of said poly-1 pattern, followed by a poly-1 etch using said poly-1 oxide pattern as a mask;

(7) Using a drain mask to define a drain/source region, followed by drain implant;

(8) Chemical vapor deposition of a CVD dielectric layer to a predetermined thickness, followed by dry etch to form a dummy CVD spacer, and source implantation using a source implant photo mask;

(9) Removing the dummy CVD spacer, followed by sidewall oxide growth and forming a nitride sidewall spacer after a thin nitride deposition;

(10) Depositing a poly-2 layer;

(11) using a poly-2 mask to define word lines, followed by poly-2 etch and removal of associated photoresist.

One of the key aspects of the above listed sequence of procedure is that it completely eliminates the misalignment problems between the floating gates and the field oxide. Furthermore, the present invention also eliminates the disparity problem in the peripheral length of the control gate between mirror flash memory cells.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

Figure 2A:
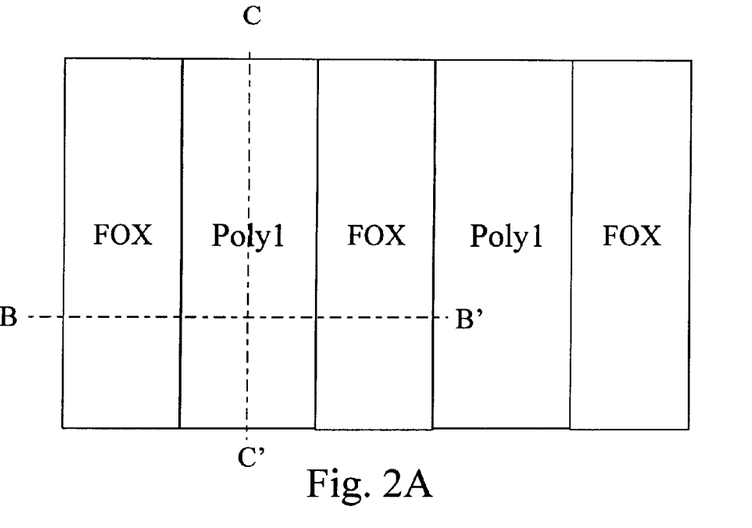
FIG. 2A is a top view of a flash memory cell layout according to a preferred embodiment of the present invention showing that strips of poly-1 and field oxide have been formed on a substrate.
Figure 2B:
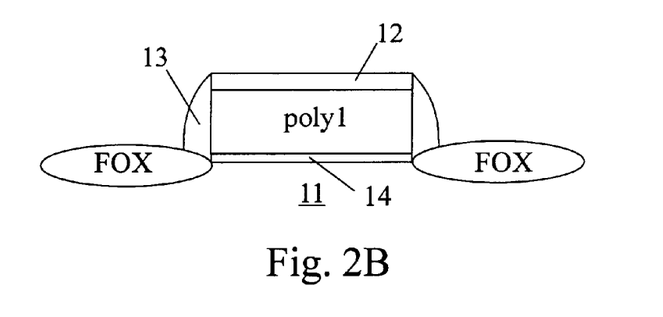
FIGS. 2B and 2C are illustrative cross-sectional views of the flash memory cell as shown in FIG. 2A along lines B–B' and C–C', respectively.
Figure 2C:
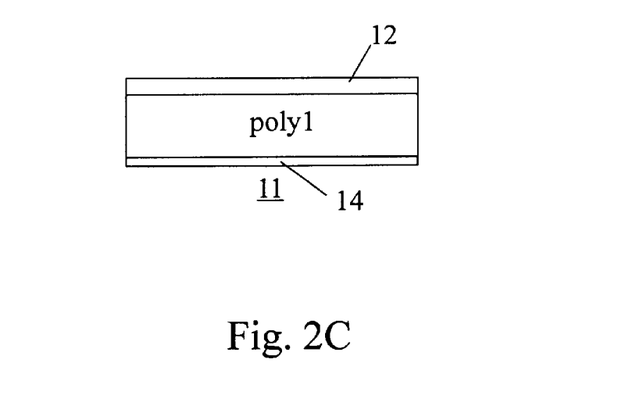

FIGS. 2A–C through 8A–C describe the main steps of preparing the improved flash memory cell according to a preferred embodiment of the present invention. These figures are discussed in more detail below:

FIGS. 2A–2C show that strips of poly-1 and field oxide have been formed on a substrate. In this step, a tunnel oxide layer 14 is formed on a substrate 11, followed by the deposition of a poly-1 layer with subsequent implantation, and the deposition of a first nitride layer, 12. A poly-1 photomask, not shown, is formed to define a plurality of stripes along a first direction, i.e., the column direction, or B–B', and an etching operation is conducted to remove the stacks of the first nitride layer, poly-1 layer, and tunnel oxide layer 14 not covered by the photoresist. After the photoresist is removed, a thin second nitride layer is formed on the first nitride layer which is then dry-etched to form a sidewall spacer 13 on the sides of the poly-1 layer. Finally a plurality of field oxide stripes, FOX, are formed by LOCOS (localized oxidation of silicon) or other similar isolation techniques, in regions not covered by poly-1. It should be noted that in the present invention, no poly oxidation is formed nor required because the poly 1 layer is completely sealed by the nitride on both the top and the sidewall regions thereof.

Figure 3A:
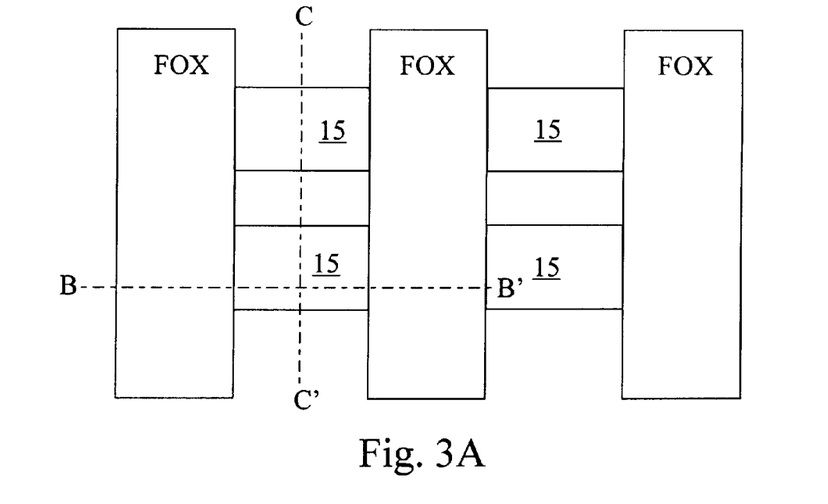
FIG. 3A is a top view of the flash memory cell layout showing that the poly-1 pattern is defined along B–B' direction, followed by nitride etch on top of the poly-1 pattern and poly oxidation.
Figure 3B:
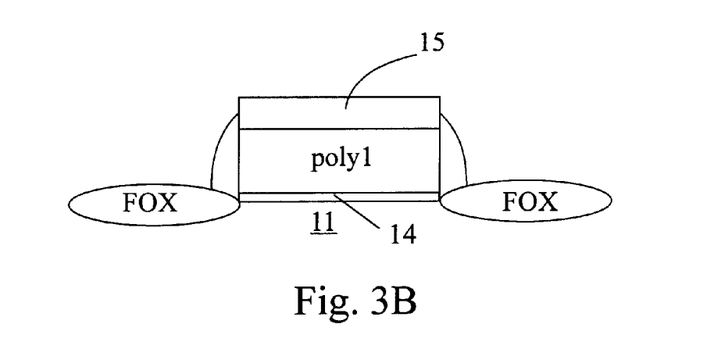
FIGS. 3B and 3C are illustrative cross-sectional views of the flash memory cell as shown in FIG. 3A along lines B–B' and C–C', respectively.
Figure 3C:
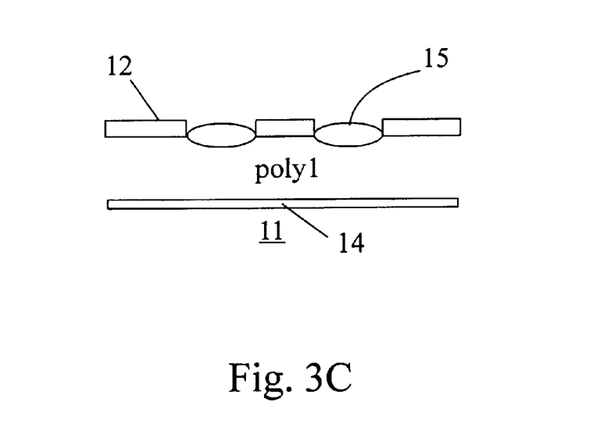

FIGS. 3A–3C show that the poly-1 pattern is defined along B–B' direction, followed by nitride etch on top of the poly-1 pattern and poly oxidation. In this step, a poly-2 photomask, not shown, is formed to define a discontinuous poly-1 pattern in the second direction, or the row direction, C—C. Then, the portion of the nitride layer not covered by the photoresist is removed by etching, using the poly-1 layer as the etching stop. After the removal of the photoresist, the newly revealed poly-1 layer is then oxidized to form a discontinuous poly-1 oxide layer 15 in the top portion of the poly-1 layer.

Figure 4A:
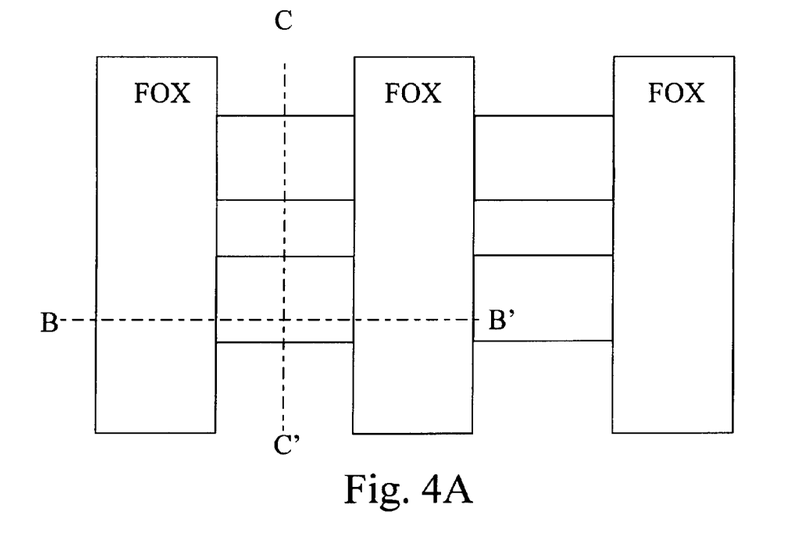
FIG. 4A is a top view of a flash memory cell layout showing the removal of the remaining nitride including the nitride spacer, followed by poly-1 etch using the poly oxide as the mask.
Figure 4B:
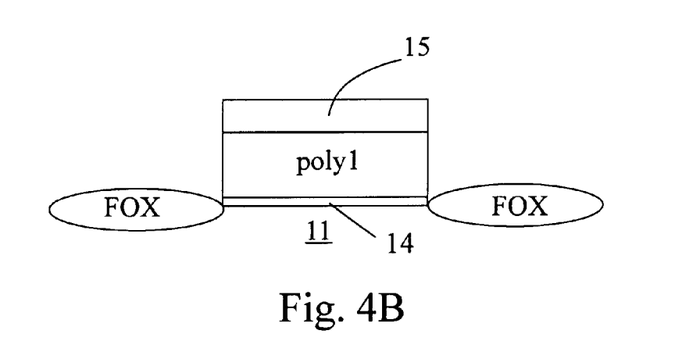
FIGS. 4B and 4C are illustrative cross-sectional views of the flash memory cell as shown in FIG. 4A along lines B–B' and C–C', respectively.
Figure 4C:
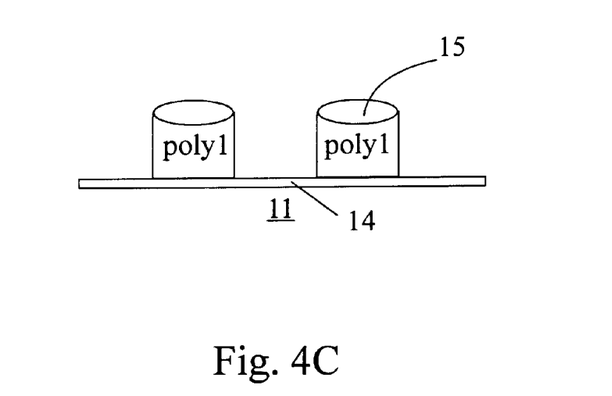

FIGS. 4A–4C show the removal of the remaining nitride including the nitride sidewall spacer, followed by poly-1 etch using the poly oxide as the mask. In this step, the remaining nitride layer including the nitride sidewall spacer is firt removed. Then, the poly-1 oxide layer 15 is used as a mask to etch the portion of the poly-1 not covered by the poly oxide layer. The poly-1 layer will ultimately become floating gates.

Figure 5A:
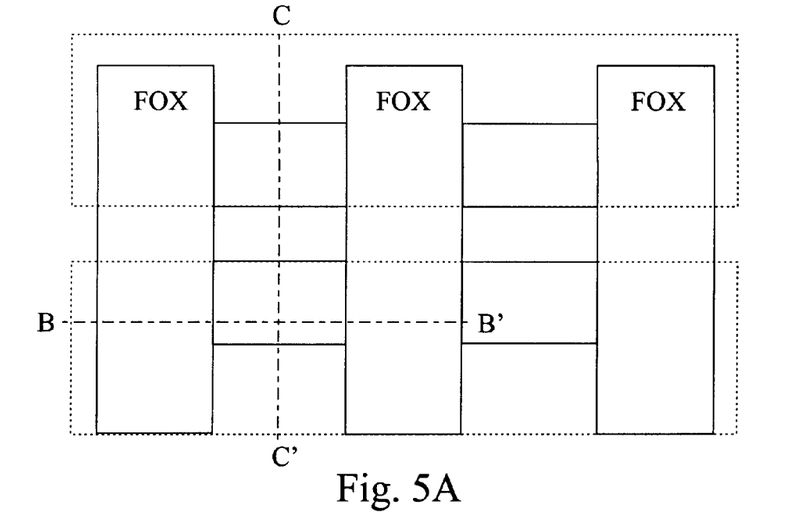
FIG. 5A is a top view of a flash memory cell layout showing the removal of some of the tunnel oxide in the drain region followed by drain implantation.
Figure 5B:
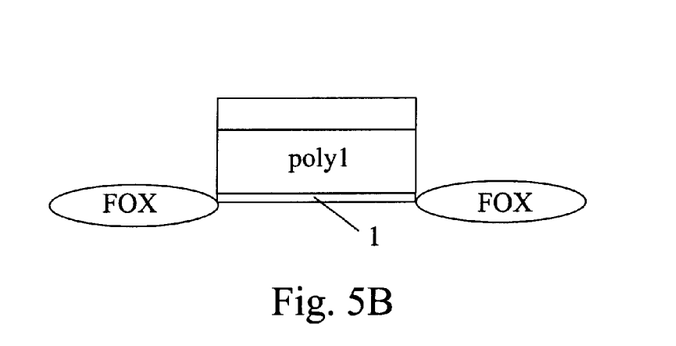
FIGS. 5B and 5C are illustrative cross-sectional views of the flash memory cell as shown in FIG. 5A along lines B–B' and C–C', respectively.
Figure 5C:
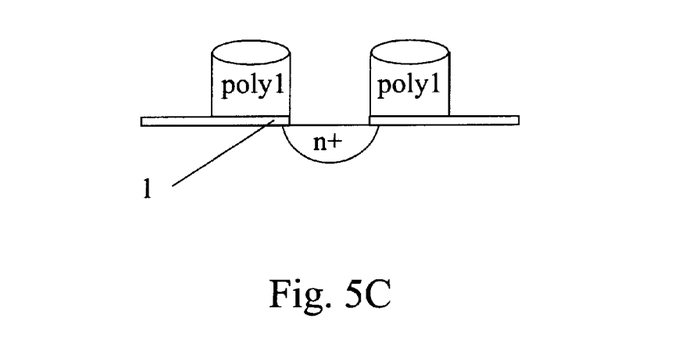

FIGS. 5A–5C show the formation of a drain implant photo mask to remove some of the tunnel oxide, and to allow for drain implantation. In this step, a drain implant photomask 16 is first formed above the substrate covering the intended drain region. Then any portion of the field oxide layer coinciding with the intended drain region is removed to prepare for subsequent drain implants. The drain region 17 can be formed using arsenic or phosphorous implantation, followed by annealing.

Figure 6A:
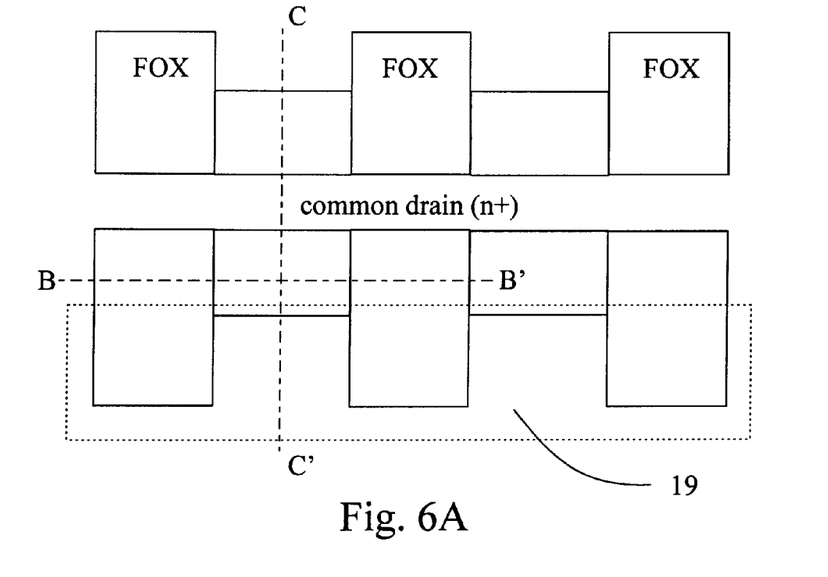
FIG. 6A is a top view of a flash memory cell layout showing the formation of CVD dielectric dummy spacers by CVD dielectric deposition and dry etch, followed by source implantation.
Figure 6B:
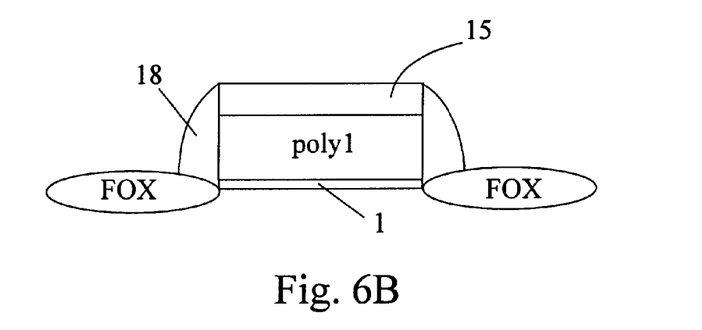
FIGS. 6B and 6C are illustrative cross-sectional views of the flash memory cell as shown in FIG. 6A along lines B–B' and C–C', respectively.
Figure 6C:
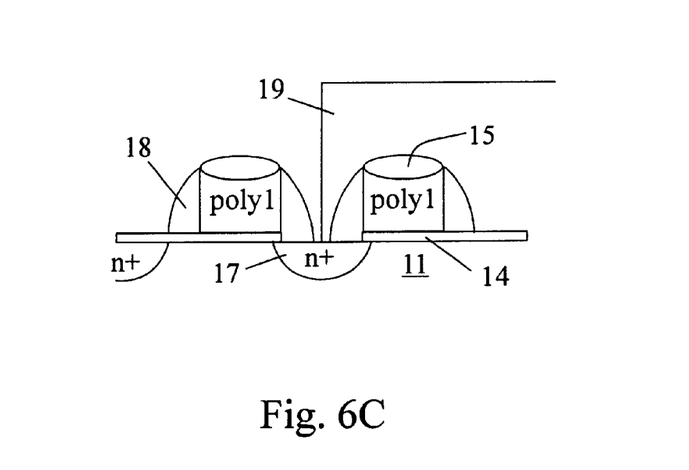

FIGS. 6A–6C show the formation of a CVD dielectric dummy spacer by CVD dielectric deposition and dry etch, followed by source implantation. In this step, a CVD dielectric layer such as nitride layer, is formed by chemical vapor deposition, on the poly-1 layer. The CVD dielectric layer is formed to have a thickness similar to the intended length of the periphery of the control gate (WL). A dry etch is applied to the CVD dielectric layer to cause a CVD dummy sidewall spacer 18 to be formed. Thereafter, the source region is formed using a source implant photo mask 19 in conjunction with the CVD spacer 18, and source implantation.

Figure 7A:
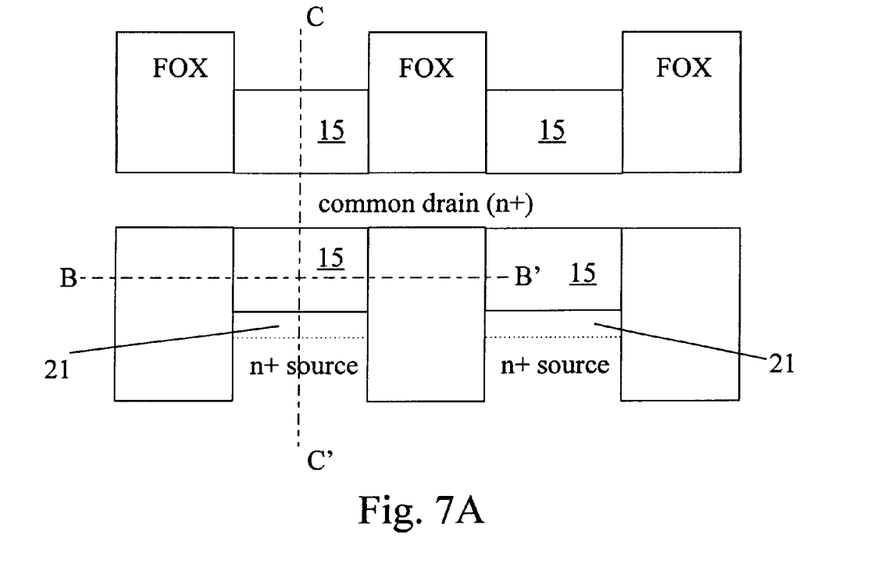
FIG. 7A is a top view of a flash memory cell layout showing the formation of nitride spacers after the removal of the CVD dielectric dummy spacers.
Figure 7B:
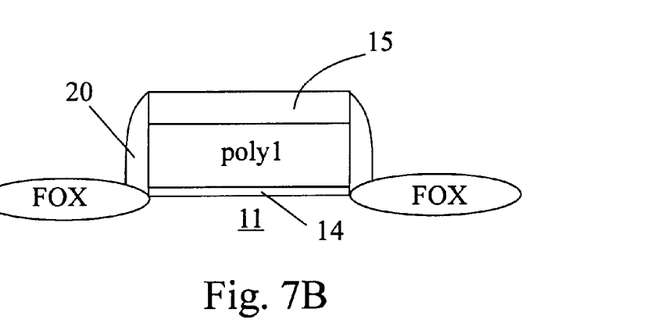
FIGS. 7B and 7C are illustrative cross-sectional views of the flash memory cell as shown in FIG. 7A along lines B–B' and C–C', respectively.
Figure 7C:
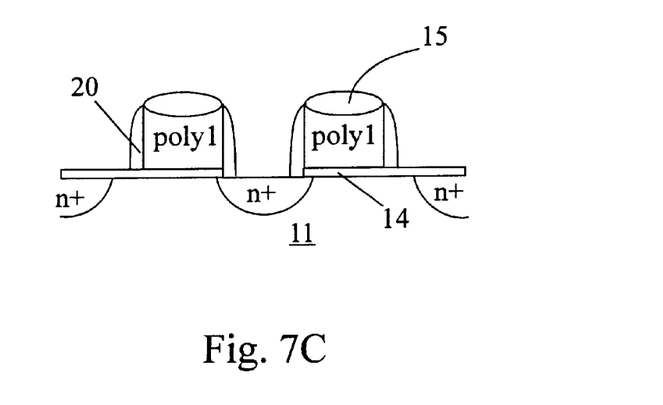

FIGS. 7A–7C show the formation of nitride spacers after the removal of the CVD dielectric dummy spacers. In this step, the dummy CVD dielectric layer 18 is removed. An oxide layer and a nitride layer are sequentially formed by oxide growth and nitride formation, respectively. After dry etch, a nitride sidewall spacer 20 is formed on the side of the poly-1 layer. The oxide layer beneath the nitride sidewall spacer serves as an isolation between the poly 1 sharp corner and the poly 2. Finally, a peripheral oxide layer is formed on the nitride sidewall space by peripheral device gate oxide growth to form a peripheral oxide.

Figure 8A:
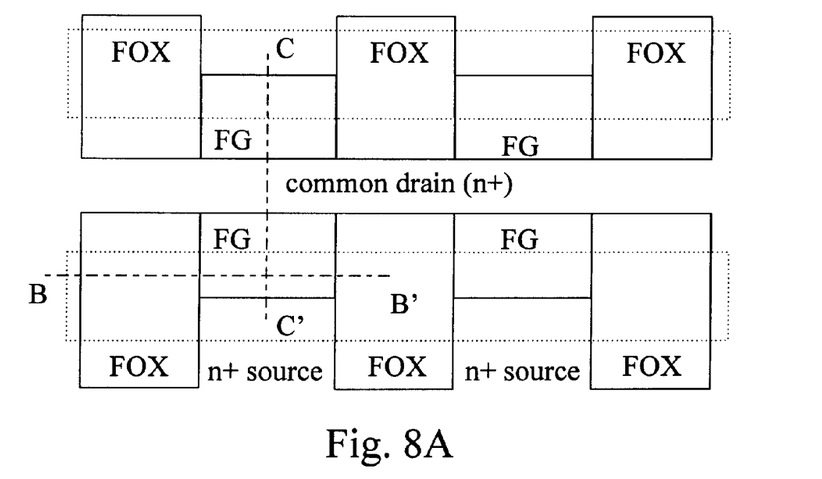
FIG. 8A is a top view of a flash memory cell layout showing the formation of poly-2 to define WL (word line) including periphery length.
Figure 8B:
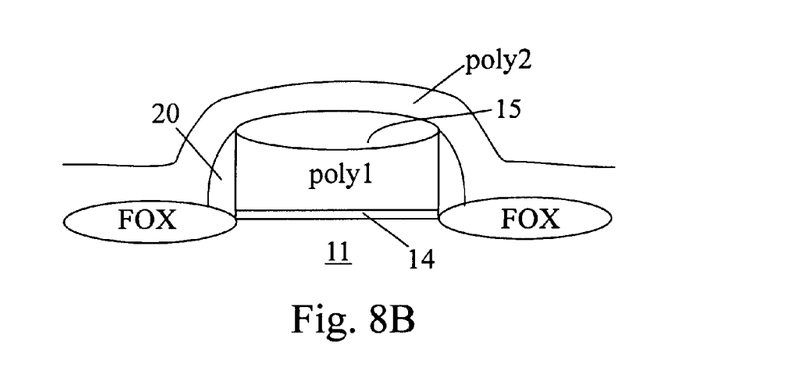
FIGS. 8B and 8C are illustrative cross-sectional views of the flash memory cell as shown in FIG. 8A along lines B–B' and C–C', respectively.
Figure 8C:
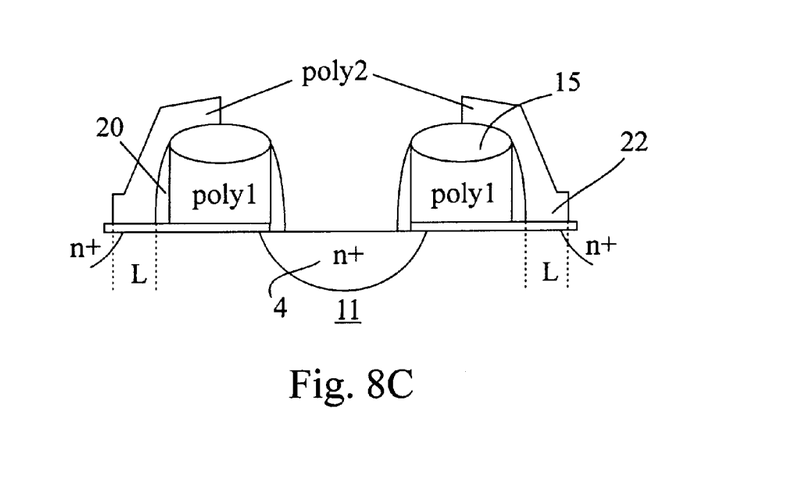

FIGS. 8A–8C show the formation of poly-2 to define WL (word line). In this step, a poly-2 layer is deposited on the substrate followed by implantation. Then a poly-2 mask is formed to define the word line (WL) and the periphery (or base) of the control gate 21 having a uniform peripheral length of L. After a poly-2 etching, the remaining photoresist is removed to from the control gate in the form of word lines.

As shown in FIGS. 2A–2C, the field oxide is formed after the formation of the poly-1 stripes, thus, the misalignment problems often encountered in the prior art processes between the floating gates and the field oxide layer are eliminated or at least minimized. Comparing FIG. 8A with FIG. 1A, the present invention also allows zero overlap of floating gate (FG) on top of field oxide. The cell programming in the present invention is achieved through source coupling, as opposed to the conventional gate coupling, and, therefore, zero overlap of floating gate over field oxide does not degrade the programming efficiency. Furthermore, the sidewall spacer 21 is formed to have a uniform predetermined thickness. By this arrangement, the periphery (or base) portions of the control gates 21 are controlled to have a uniform length of L between mirror cells. All of these improvements can significantly contribute to the reduction of cell size without involving expensive upgrades in processing equipment.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for fabricating split-gate flash memory cells comprising the steps of:
    (a) forming a tunnel oxide layer on a substrate, followed by the deposition of a poly-1 layer and a first nitride layer.
    (b) using a first poly-1 mask to define a plurality of poly-1 stripes along a first direction, followed by a nitride/poly-1/oxide etch;
    (c) depositing a second nitride layer, followed by anisotropic etch to from a nitride spacer around said poly-1 stripes;
    (d) growing field oxide to form a field oxide layer having a plurality of isolation regions in areas not covered by said poly-1 stripes;
    (e) using a second poly-2 mask define a poly-1 pattern along a second direction, followed by a nitride etch on top of said poly-1 pattern and a poly-1 oxidation to form a poly-1 oxide pattern on top of said poly-1 stripes;
    (f) removing remaining nitride on top of said poly-1 pattern, followed by a poly-1 etch using said poly-1 oxide pattern as a mask;
    (g) using a drain mask to define a source region, followed by drain implant;
    (h) chemical vapor deposition of a CVD dielectric layer having a predetermined thickness, followed by dry etch to form a dummy CVD spacer;
    (i) using a source implant photo mask to define a source region, followed by source implantation;
    (j) removing said dummy CVD spacer, followed by sidewall oxide growth and then forming a nitride sidewall spacer after a thin nitride deposition;
    (k) depositing a poly-2 layer;
    (l) using a poly-2 mask and a photoresist to define word lines and control gate peripheries, followed by poly-2 etch and removal of said photoresist.

2. The method for fabricating split-gate flash memory cells according to claim 1 wherein said field oxide layer is formed by localized oxidation of silicon.

3. The method for fabricating split-gate flash memory cells according to claim 1 wherein said nitride etch in step (e) is conducted under conditions such that said poly-1 layer is used as an etch stop.

4. The method for fabricating split-gate flash memory cells according to claim 1 wherein said source region is formed using arsenic or phosphorous implantation, followed by annealing.

5. The method for fabricating split-gate flash memory cells according to claim 1 wherein said CVD dielectric layer is formed to have a thickness similar to an intended length of said control gates peripheries.

6. The method for fabricating split-gate flash memory cells according to claim 1 wherein said drain region is formed using arsenic or phosphorous implantation, followed by annealing.

7. The method for fabricating split-gate flash memory cells according to claim 1 wherein said poly-1 strips form floating gates of said flash memory cells.

8. The method for fabricating split-gate flash memory cells according to claim 1 wherein said floating gates have zero overlap with said field oxide layer.

* * * * *